US012765028B2

(12) United States Patent
Su et al.

(10) Patent No.: US 12,765,028 B2
(45) Date of Patent: Oct. 13, 2026

(54) SEMICONDUCTOR STRUCTURE AND FORMING METHOD THEREFOR

(71) Applicants: Semiconductor Manufacturing International (Shanghai) Corporation, Shanghai (CN); Semiconductor Manufacturing International (Beijing) Corporation, Beijing (CN)

(72) Inventors: Bo Su, Shanghai (CN); Hansu Oh, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 673 days.

(21) Appl. No.: 18/124,768

(22) Filed: Mar. 22, 2023

(65) Prior Publication Data

US 2023/0238449 A1 Jul. 27, 2023

Related U.S. Application Data

(63) Continuation of application No. PCT/CN2020/117831, filed on Sep. 25, 2020.

(51) Int. Cl.
*H10D 64/01* (2025.01)
*H10P 50/28* (2026.01)
*H10W 20/00* (2026.01)

(52) U.S. Cl.
CPC ......... *H10D 64/017* (2025.01); *H10D 64/021* (2025.01); *H10P 50/283* (2026.01);
(Continued)

(58) Field of Classification Search
CPC ......... H01L 21/31116; H01L 21/76834; H01L 21/76877; H01L 21/76897; H10D 64/021
See application file for complete search history.

(56) References Cited

U.S. PATENT DOCUMENTS 10,170,573 B1 * 1/2019 Chiang ................ H10D 64/511
2019/0006484 A1 * 1/2019 Wu ................... H01L 21/32139
(Continued)

FOREIGN PATENT DOCUMENTS

CN 108074866 5/2018
CN 109904120 6/2019
(Continued)

OTHER PUBLICATIONS

International Search Report issued Jun. 9, 2021 in International (PCT) Application No. PCT/CN2020/117831.

*Primary Examiner* — Jeff W Natalini
*Assistant Examiner* — Rose Keagy
(74) *Attorney, Agent, or Firm* — Crowell & Moring LLP

(57) ABSTRACT

A semiconductor structure and a forming method therefor are provided. The forming method includes: providing a base, a gate structure, a source/drain doped area, and a bottom dielectric layer; forming a source/drain interconnect layer running through the bottom dielectric layer on a top of the source/drain doped area; forming a top dielectric layer on the bottom dielectric layer; forming a gate contact running through the top dielectric layer on a top of the gate structure and a source/drain contact running through the top dielectric layer on a top of the source/drain interconnect layer; forming a sacrificial side wall layer on side walls of the gate contact and the source/drain contact; forming a gate plug filling the gate contact and a source/drain plug filling
(Continued)

the source/drain contact; removing the sacrificial side wall layer to form a first gap; and forming a sealing layer sealing the first gap.

5 Claims, 7 Drawing Sheets

(52) U.S. Cl.
CPC ....... *H10W 20/056* (2026.01); *H10W 20/069* (2026.01); *H10W 20/077* (2026.01)

(56) References Cited

U.S. PATENT DOCUMENTS

| | | | | |
|---|---|---|---|---|
| 2019/0181223 | A1* | 6/2019 | Tang | H10D 64/679 |
| 2019/0312123 | A1* | 10/2019 | Cheng | H01L 21/7682 |
| 2020/0066866 | A1* | 2/2020 | Cheng | H01L 21/76897 |
| 2020/0235094 | A1 | 7/2020 | Bergendahl et al. | |

FOREIGN PATENT DOCUMENTS

| | | |
|---|---|---|
| CN | 110071046 | 7/2019 |
| CN | 110416157 | 11/2019 |

* cited by examiner

SEMICONDUCTOR STRUCTURE AND FORMING METHOD THEREFOR

CROSS REFERENCE TO RELATED APPLICATIONS

This application is a continuation application of PCT Patent Application No. PCT/CN2020/117831, filed on Sep. 25, 2020, the entire content of which is incorporated herein by reference.

TECHNICAL FIELD

The present disclosure relates to the field of semiconductor manufacturing, and in particular to a semiconductor structure and a forming method therefor.

BACKGROUND

With the continuous development of integrated circuit manufacturing technology, the requirements for integrated level and performance of integrated circuits are higher and higher. In order to improve the integrated level and reduce the cost, critical dimensions of components are getting smaller, and circuit density inside integrated circuits is getting higher. This development makes it impossible for a wafer surface to provide enough area for required lines.

In order to meet the requirements of the lines after the critical dimensions are reduced, at present, the conduction between different metal layers or between a metal layer and a base is realized through an interconnect structure. The interconnect structure includes a line and a contact plug formed in a contact opening. The contact plug is connected to a semiconductor device, and the line realizes the connection between the contact plugs, thereby forming a circuit. The contact plug in a transistor structure includes a gate contact plug located on a gate structure and configured to connect between the gate structure and an external circuit, and further includes a source/drain contact plug located on a source/drain doped area and configured to connect between the source/drain doped area and the external circuit.

At present, in order to further reduce the area of the transistor, a contact over active gate (COAG) process is introduced. Compared with the conventional gate contact plug located above the gate structure in an isolation area, the COAG process allows the gate contact plug above the gate structure in an active area (AA), thereby further saving area of a chip.

SUMMARY

The present disclosure relates to a semiconductor structure and a forming method therefor to improve performance of the semiconductor structure.

In an aspect of the disclosure, a method for forming a semiconductor structure is provided. The method may include:

- providing a base, a gate structure located on the base, a source/drain doped area located in the base on two sides of the gate structure, and a bottom dielectric layer located on the base at a side of the gate structure and covering the source/drain doped area; forming a source/drain interconnect layer running through the bottom dielectric layer on a top of the source/drain doped area and contacting the source/drain doped area; forming a top dielectric layer on the bottom dielectric layer to cover the gate structure and the source/drain interconnect layer; forming a gate contact running through the top dielectric layer on a top of the gate structure and exposing the top of the gate structure, and a source/drain contact running through the top dielectric layer on a top of the source/drain interconnect layer and exposing the top of the source/drain interconnect layer; forming a sacrificial side wall layer on side walls of the gate contact and the source/drain contact; forming, on the sacrificial side wall layer, a gate plug filling the gate contact and a source/drain plug filling the source/drain contact; removing the sacrificial side wall layer to form a first gap exposing a side wall of the gate plug and a side wall of the source/drain plug; and forming a sealing layer sealing the first gap so that a first portion of the first gap located on the side wall of the source/drain plug or a second portion of the first gap located on the side wall of the gate plug and the sealing layer forms a first air gap.

In another aspect of the disclosure, a semiconductor structure is provided. The semiconductor structure may include:

- a base; a gate structure located on the base; a source/drain doped area located in the base on two sides of the gate structure; a source/drain interconnect layer located on a top of the source/drain doped area and contacting the source/drain doped area; a gate plug located on a top of the gate structure and contacting the gate structure; a source/drain plug located on a top of the source/drain interconnect layer and contacting the source/drain interconnect layer; a dielectric layer, covering side walls of the gate plug and the source/drain plug and filling between the gate plug and the source/drain plug; a first gap located between the side wall of the gate plug and the dielectric layer and between the side wall of the source/drain plug and the dielectric layer; and a sealing layer located on the dielectric layer and sealing the first gap, a first portion of the first gap located on the side wall of the source/drain plug or a second portion of the first gap located on the side wall of the gate plug and the sealing layer forming a first air gap.

In the method for forming a semiconductor structure according to the implementations of the present disclosure, after the gate contact and the source/drain contact are formed, the sacrificial side wall layer is further formed on the side walls of the gate contact and the source/drain contact; then, the gate plug filling the gate contact and the source/drain plug filling the source/drain contact are formed on the sacrificial side wall layer, and the sacrificial side wall layer is removed to form the first gap exposing the side wall of the gate plug and the side wall of the source/drain plug; and the sealing layer sealing the first gap is formed on the gate plug and the source/drain plug so that at least one of the first gap located on the side wall of the source/drain plug and the first gap located on the side wall of the gate plug and the sealing layer form the first air gap.

According to the implementations of the present disclosure, the sacrificial side wall layer configured to occupy a space for the first gap is firstly formed. After the gate plug and the source/drain plug are formed, the sacrificial side wall layer is removed, thereby forming the first gap on the side wall of the gate plug and the side wall of the source/drain plug. Then, the top of the first gap is sealed, so that at least one of the first gap located on the side wall of the source/drain plug and the first gap located on the side wall of the gate plug and the sealing layer form the first air gap. The air gap has a lower dielectric constant than the dielectric material (for example, a low k dielectric material or an ultra-low k dielectric material) commonly used in the semiconductor process, which is beneficial to reduce parasitic capacitance between the gate plug and the source/drain plug and reduce delay of resistance capacitance (RC), thereby improving the performance of the semiconductor structure.

In an implementation, the base includes an active area. The forming method further includes: after the base is provided and before the source/drain interconnect layer is formed, a partial thickness of the gate structure is removed to form a gate cap layer on the top of the remaining gate structure. The gate contact runs through the gate cap layer and the top dielectric layer on the top of the gate structure in the active area. Accordingly, in the step of forming the gate plug, the gate plug is located above the gate structure in the active area. The gate plug is the contact over active gate (COAG). Compared with the conventional gate plug located in the isolation area, in the implementations of the present disclosure, the distance between the gate plug and the source/drain plug is shorter. The first gap is formed on the side wall of the gate plug and the side wall of the source/drain plug, and the first gap is sealed to form the first air gap on at least one of the side walls of the source/drain plug and the gate plug, which is beneficial to significantly reduce the parasitic capacitance between the gate plug and the source/drain plug and reduce the delay of RC, thereby significantly improving the performance of the semiconductor structure.

DETAILED DESCRIPTION

Figure 1:
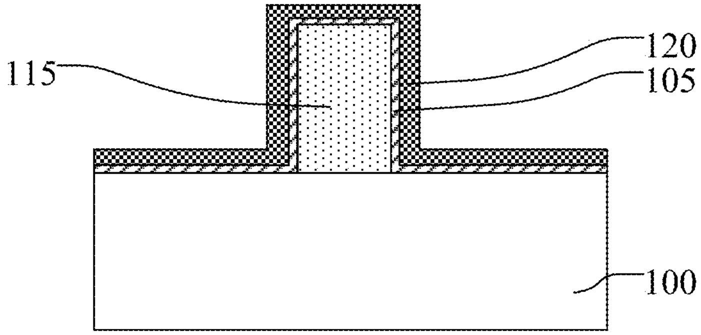
FIG. 1 to FIG. 16 are schematic structural diagrams corresponding to steps of forming a semiconductor structure according to an implementation of the present disclosure.

As can be known from the background, the COAG process is beneficial to save the area of the chip. However, the currently formed device still has poor performance. Specifically, in the COAG process, the gate contact plug formed by the COAG process is located above the gate structure in the active area (AA), and the distance between the gate contact plug and the source/drain contact plug is shorter as compared with the conventional gate contact plug located above the gate structure in the isolation area, which easily leads to excessive parasitic capacitance between the gate contact plug and the source/drain contact plug, resulting in poor performance of the device.

In order to address the technical problem, in the method for forming a semiconductor structure according to the implementations of the present disclosure, the sacrificial side wall layer configured to occupy a space for the first gap is firstly formed. After the gate plug and the source/drain plug are formed, the sacrificial side wall layer is removed, thereby forming the first gap on the side wall of the gate plug and the side wall of the source/drain plug. Then, the top of the first gap is sealed, so that at least one of the first gap located on the side wall of the source/drain plug and the first gap located on the side wall of the gate plug and the sealing layer form the first air gap. The air gap has a lower dielectric constant than the dielectric material (for example, a low k dielectric material or an ultra-low k dielectric material) commonly used in the semiconductor process, which is beneficial to reduce parasitic capacitance between the gate plug and the source/drain plug and reduce delay of RC, thereby improving the performance of the semiconductor structure.

To make the foregoing objectives, features, and advantages of the implementations of the present disclosure more apparent and easier to understand, specific implementations of the present disclosure are described in detail below with reference to the accompanying drawings.

FIG. 1 to FIG. 16 are schematic structural diagrams corresponding to steps in an implementation of a method for forming a semiconductor structure according to the present disclosure.

Referring to FIG. 1 to FIG. 5, a base 100, a gate structure 110 located on the base 100, a source/drain doped area 130 located in the base 100 on two sides of the gate structure 110, and a bottom dielectric layer 135 located on the base 100 at a side of the gate structure 110 and covering the source/drain doped area 130 are provided.

The base 100 is configured to provide a process platform for the subsequent process. In this implementation, the base 100 is a planar substrate. In other implementations, the base may alternatively be a three-dimensional base. For example, the base includes a substrate and a fin protruding from the substrate. In this implementation, the base 100 is a silicon substrate. In other implementations, the base may alternatively be a substrate of another type of material. The base 100 includes an active area (AA) 100*a*.

The gate structure 110, as a gate of a device, is configured to control a conductive channel to be on or off when the device works. In this implementation, the gate structure 110 is a metal gate structure, and the gate structure 110 is formed by a high k last metal gate last process.

The source/drain doped area 130 is configured to provide a carrier source when the device works.

The bottom dielectric layer 135 is configured to isolate adjacent devices. A material of the bottom dielectric layer 135 is an insulating material, including one or more of silicon oxide, silicon nitride, silicon oxynitride, silicon oxycarbide, silicon carbonitride and silicon oxycarbonitride. In this implementation, the material of the bottom dielectric layer 135 is silicon oxide.

In this implementation, a dummy spacer 120 contacting a side wall of the gate structure 110 and a contact etch stop layer (CESL) 140 located on a side wall of the dummy spacer 120 are further formed between the side wall of the gate structure 110 and the bottom dielectric layer 135. The contact etch stop layer 140 is also located between the source/drain doped area 130 and the bottom dielectric layer 135.

A subsequent step further includes: the dummy spacer 120 is removed to form a second gap on the side wall of the gate structure 110. The second gap is located between the contact etch stop layer 140 and the side wall of the gate structure 110. Therefore, the dummy spacer 120 is configured to occupy a space for the formation of the second gap, thereby subsequently forming a cover dielectric layer sealing the second gap. Moreover, a dielectric constant of a material of the cover dielectric layer is lower than a dielectric constant of a material of the dummy spacer 120, so that the material on the side wall of the gate structure 110 has a lower dielectric constant, which is beneficial to reduce the parasitic capacitance of the semiconductor structure, for example, reduce the effective capacitance between the gate structure 110 and the subsequently formed source/drain interconnect layer, and thus is beneficial to improve the performance of the semiconductor structure.

Moreover, the subsequent cover dielectric layer is made of a material with a lower dielectric constant, for example, a low k dielectric material, an ultra-low k dielectric material or the like. In order to make the material of the cover dielectric layer have a lower dielectric constant, the material of the cover dielectric layer is typically a material with loose structure and low density. By firstly forming the dummy spacer 120 configured to occupy the space for the second gap, the material of the dummy spacer 120 can be flexibly selected, so that the material of the dummy spacer 120 is compatible with the subsequent process (for example, the requirement for the dielectric constant of the material of the dummy spacer 120 is low). Accordingly, a material with higher density and etching resistance can be selected as the material of the dummy spacer 120, which is beneficial to reduce the probability of damage or removal of the dummy spacer 120 due to mistaken etching during the formation of the semiconductor structure, thereby ensuring the completeness of the dummy spacer 120 and accordingly ensuring the dimensions and position of the second gap to meet the design requirements. Further, the insulation effect between the gate structure 110 and other conductive structures (for example, the source/drain interconnect layer) is ensured, and accordingly the performance of the semiconductor structure is improved.

Specifically, in this implementation, a process for forming the source/drain doped area 130 includes a step of pre-cleaning and a step of forming the gate structure 110 that includes removing the dummy gate to expose a gate opening of the dummy spacer 120. The dummy spacer 120 has high density and etching resistance, which is beneficial to reduce the probability of mistaken etching of the dummy spacer 120 in these two steps.

In this implementation, the material of the dummy spacer 120 includes one or more of silicon oxide, silicon nitride, silicon carbide, silicon oxynitride, boron nitride, aluminum oxide and aluminum nitride. In an example, the material of the dummy spacer 120 is an oxygen-containing material. Specifically, the material of the dummy spacer 120 is silicon oxide. The silicon oxide is an easily accessible insulating material commonly used in the semiconductor process, which is beneficial to improve the compatibility of the dummy spacer 120 with the existing process, reduce the risk of the process and save the cost.

The thickness of the dummy spacer 120 should not be too small, otherwise the width of the second gap subsequently formed along the direction perpendicular to the side wall of the gate structure 110 is also small, and thus it is difficult for the material of the top dielectric layer to fill the second gap subsequently, resulting in an insignificant effect of reducing the effective capacitance between the gate structure 110 and the source/drain interconnect layer. The thickness of the dummy spacer 120 should not be too large either, otherwise the channel length will be too large along the direction perpendicular to the side wall of the gate structure 110, making it difficult to meet the requirements of device miniaturization. Therefore, in the direction parallel to a surface of the base 100 and perpendicular to the side wall of the gate structure 110, the thickness of the dummy spacer 120 is 2 nm to 12 nm.

Subsequently, the source/drain interconnect layer contacting the source/drain doped area 130 is formed in the bottom dielectric layer 135 on the top of the source/drain doped area 130. A process for forming the source/drain interconnect layer includes a step of etching the bottom dielectric layer 135 to form an interconnect via. The contact etch stop layer 140 is configured to temporarily define an etch stop position during the formation of the interconnect via, thereby improving the etching consistency and helping to prevent damage to the source/drain doped area 130.

In this implementation, a material of the contact etch stop layer 140 is a low k dielectric material or an ultra-low k dielectric material, so that the contact etch stop layer 140 located between the dummy spacer 120 and the bottom dielectric layer 135 can further reduce the effective capacitance between the gate structure 110 and the source/drain interconnect layer. In other implementations, the material of the contact etch stop layer may alternatively be silicon nitride.

In this implementation, an anti-diffusion layer 125 is further formed between the dummy spacer 120 and the contact etch stop layer 140 and configured to prevent diffusible ions in the dummy spacer 120 from diffusing into the contact etch stop layer 140, thereby avoiding adverse effects on the material of the contact etch stop layer 140 due to ion diffusion. In an example where the material of the dummy spacer 120 is an oxygen-containing material (for example, silicon oxide), when oxygen ions diffuse into the contact etch stop layer 140, the dielectric constant of the material of the contact etch stop layer 140 will increase. The formed anti-diffusion layer 125 can reduce the probability of the increase in the dielectric constant of the material of the contact etch stop layer 140.

Therefore, the anti-diffusion layer 125 has higher density, and the anti-diffusion layer 125 is reserved subsequently. The material of the anti-diffusion layer 125 is an insulating material. Specifically, the material of the anti-diffusion layer 125 includes one or more of silicon nitride, silicon carbide, silicon carbonitride, silicon oxycarbonitride, silicon oxynitride, boron nitride, boron carbonitride, aluminum oxide and aluminum nitride. In an example, the material of the anti-diffusion layer 125 is silicon nitride.

It should be noted that after the source/drain interconnect layer is formed subsequently, the anti-diffusion layer 125 is also located between the source/drain interconnect layer and the gate structure 110, so the anti-diffusion layer 125 also affects the effective capacitance between the source/drain interconnect layer and the gate structure 110. Therefore, while ensuring the effectiveness of the anti-diffusion layer 125 in preventing ion diffusion, in order to prevent an excessive effective capacitance between the source/drain interconnect layer and the gate structure 110 and prevent an excessive distance between the source/drain interconnect layer and the gate structure 110 from occupying too much area of the chip, the thickness of the anti-diffusion layer 125 is less than or equal to 30 Å. In this implementation, the thickness of the anti-diffusion layer 125 is less than or equal to 15 Å. An excessively small thickness of the anti-diffusion layer 125 may cause less effectiveness of the anti-diffusion layer 125 in preventing ion diffusion. Therefore, in this implementation, the thickness of the anti-diffusion layer 125 is 5 Å to 15 Å.

The step of providing the base 100 according to the present disclosure will be described in detail below in conjunction with the accompanying drawings.

As shown in FIG. 1, the base 100 is formed. A dummy gate 115 is formed on the base 100.

The dummy gate 115 is configured to occupy a space for the formation of the gate structure. The dummy gate 115 is a single-layer or laminated structure. In this implementation, the dummy gate 115 is a single-layer structure, and a material of the dummy gate 115 is polysilicon.

As shown in FIG. 1, the dummy spacer 120 is formed on a side wall of the dummy gate 115. In this implementation, the dummy spacer 120 is further formed on a top of the dummy gate 115 and the base 100.

In this implementation, a process for forming the dummy spacer 120 includes atomic layer deposition. The atomic layer deposition has high step covering power, and is beneficial to improve the thickness uniformity of the dummy spacer 120.

In this implementation, before the dummy spacer 120 is formed, the forming method further includes: an offset spacer 105 is formed on the side wall of the dummy gate 115. The offset spacer 105 is configured to increase the channel length of the formed transistor, thereby improving the short-channel effect and the hot carrier effect caused by the short-channel effect.

In this implementation, the offset spacer 105 is further formed on the top of the dummy gate 115 and the base 100. Accordingly, the dummy spacer 120 is formed on the offset spacer 105.

A material of the offset spacer 105 is silicon oxide, silicon nitride, silicon oxynitride, silicon oxycarbonitride, silicon oxyboronitride or silicon oxyborocarbonitride. In this implementation, the material of the offset spacer 105 is silicon nitride.

Figure 2:
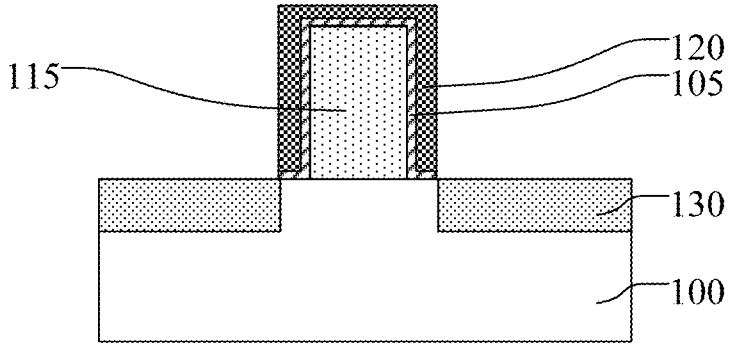

As shown in FIG. 2, the source/drain doped area 130 is formed in the base 100 on two sides of the dummy gate 115.

In this implementation, before forming the source/drain doped area 130, the forming method further includes: the dummy spacer 120 and the offset spacer 105 on the base 100 on the two sides of the dummy gate 115 are removed to expose the surface of the base 100 on the two sides of the dummy gate 115, thereby preparing for the formation of the source/drain doped area 130.

Figure 3:
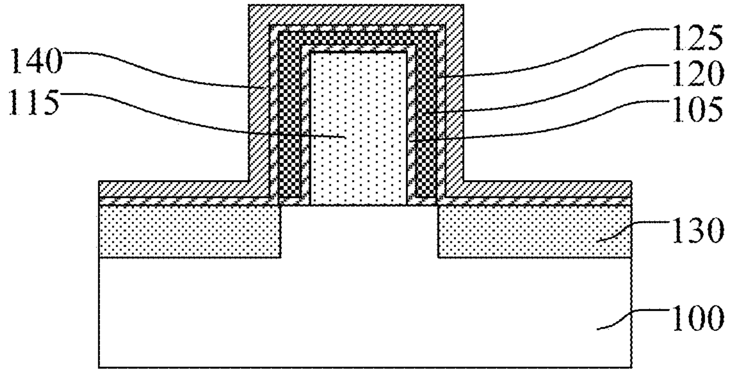

As shown in FIG. 3, the contact etch stop layer 140 conformally covering the dummy spacer 120 and the source/drain doped area 130 is formed. In this implementation, before the contact etch stop layer 140 is formed, the anti-diffusion layer 125 conformally covering the dummy spacer 120 and the source/drain doped area 130 is formed. Accordingly, the contact etch stop layer 140 is formed on the anti-diffusion layer 125.

A process for forming the anti-diffusion layer 125 includes atomic layer deposition, chemical vapor deposition or plasma enhanced chemical vapor deposition. In this implementation, since the atomic layer deposition is used to form the anti-diffusion layer 125, it is easy to form the anti-diffusion layer 125 with a small thickness. Moreover, the anti-diffusion layer 125 has good thickness uniformity and density, and in addition, the anti-diffusion layer 125 has good step covering power.

Figure 4:
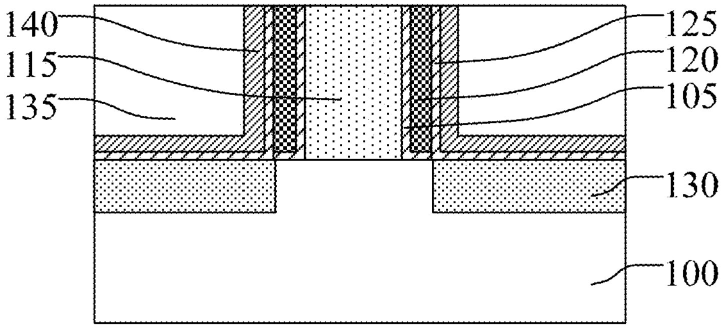

As shown in FIG. 4, the bottom dielectric layer 135 exposing the top of the dummy gate 115 is formed on the contact etch stop layer 140 on the two sides of the dummy gate 115.

In this implementation, the step of forming the bottom dielectric layer 135 includes: an initial dielectric layer (not shown) covering the top of the dummy gate 115 is formed on the base 100; and the initial dielectric layer higher than the top of the dummy gate 115 is removed to form the bottom dielectric layer 135. In this implementation, in the step of removing the initial dielectric layer higher than the top of the dummy gate 115, the offset spacer 105, the dummy spacer 120, the anti-diffusion layer 125 and the etch stop layer 140 located on the top of the dummy gate 115 are also removed to expose the top of the dummy gate 115, which facilitates subsequent removal of the dummy gate 115.

Figure 5:
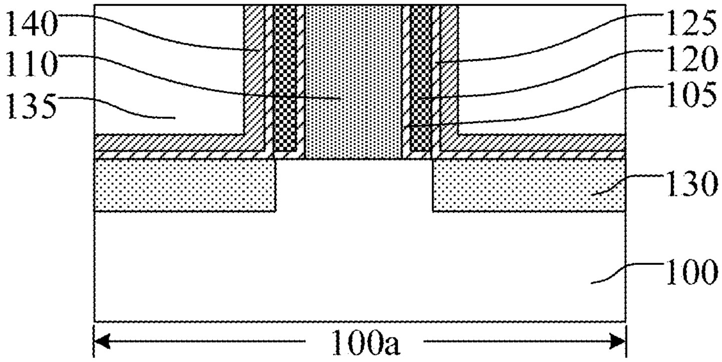

As shown in FIG. 5, the dummy gate 115 is removed to form the gate opening (not shown). The gate structure 110 is formed in the gate opening.

Figure 6:
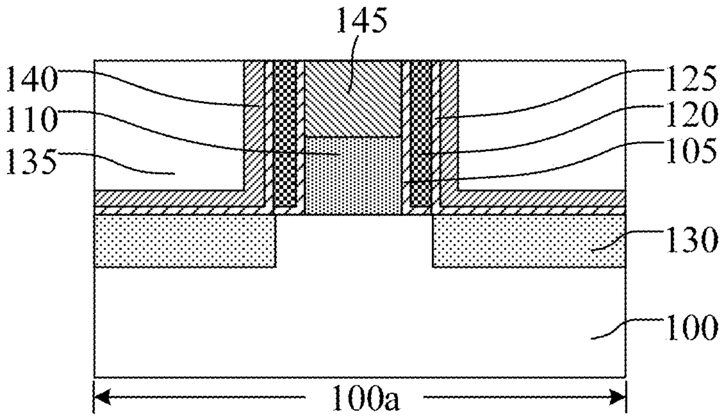

Referring to FIG. 6, in this implementation, the forming method further includes: after the base 100 is provided, a partial thickness of the gate structure 110 is removed to form a gate cap layer 145 on the top of the remaining gate structure 110. In this implementation, a top surface of the gate cap layer 145 is flush with a top surface of the bottom dielectric layer 135.

The gate cap layer 145 is configured to protect the top of the gate structure 110 during the subsequent formation of the source/drain interconnect layer and the formation of the source/drain plug, thereby reducing the damage to the gate structure 110 and the probability of short-circuiting between the gate structure 110 and the source/drain interconnect layer or the source/drain plug.

Subsequently, a source/drain cap layer is further formed on a top surface of the source/drain interconnect layer and configured to protect the top of the source/drain interconnect layer. Therefore, the gate cap layer 145 is made of a material having an etch selectivity with the source/drain cap layer, the bottom dielectric layer 135 and the subsequently formed dielectric layer, which thereby ensures that the gate cap layer 145 can protect the gate structure 110. In this implementation, the material of the gate cap layer 145 includes one or more of silicon nitride, silicon carbide, silicon carbonitride, silicon oxycarbonitride, silicon oxynitride, boron nitride and boron carbonitride. In an example, the material of the gate cap layer 145 is silicon nitride.

Figure 7:
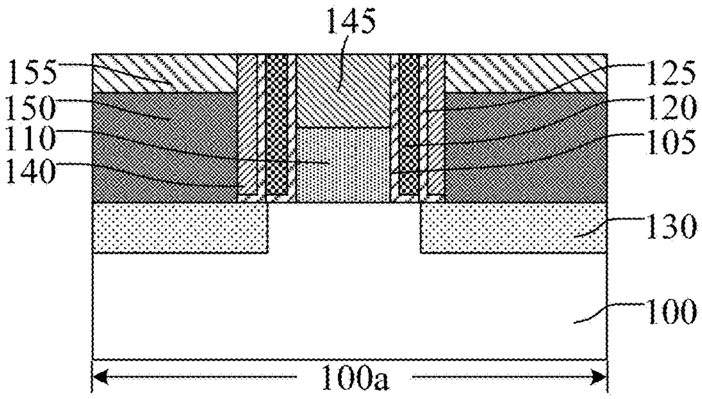

Referring to FIG. 7, the source/drain interconnect layer 150 running through the bottom dielectric layer 135 on the top of the source/drain doped area 130 and contacting the source/drain doped area 130 is formed. The source/drain interconnect layer 150 contacts the source/drain doped area 130 and is configured to electrically connect between the source/drain doped area 130 and an external circuit or other interconnect structures.

In this implementation, a material of the source/drain interconnect layer 150 is copper. The low resistivity of copper is beneficial to improve the signal delay of RC of BEOL, increase the processing speed of the chip and reduce the resistance of the source/drain interconnect layer 150, thereby correspondingly reducing the power consumption. In other implementations, the material of the source/drain interconnect layer may alternatively be a conductive material such as tungsten, cobalt or the like.

In this implementation, the source/drain interconnect layer 150 also runs through the contact etch stop layer 140 and the anti-diffusion layer 125 located on the source/drain doped area 130.

In this implementation, the forming method further includes: after the source/drain interconnect layer 150 is formed, a partial thickness of the source/drain interconnect layer 150 is removed to form the source/drain cap layer 155 on the top of the remaining source/drain interconnect layer 150.

In this implementation, a top surface of the source/drain cap layer 155 is flush with the top surface of the bottom dielectric layer 135.

Subsequently, the gate plug contacting the gate structure 110 is formed. The source/drain cap layer 155 is located on the top surface of the source/drain interconnect layer 150. During the formation of the gate plug, the source/drain cap layer 155 can protect the source/drain interconnect layer 150, which is beneficial to reduce the damage to the source/drain interconnect layer 150 and reduce the probability of short-circuiting between the gate plug and the source/drain interconnect layer 150.

The source/drain cap layer 155 is made of a material having a higher etch selectivity with the gate cap layer 145, the dummy spacer 120, the bottom dielectric layer 135 and the subsequent dielectric layer, which thereby ensures that the source/drain cap layer 155 can protect the source/drain interconnect layer 150. In this implementation, the material of the source/drain cap layer 155 includes one or more of silicon nitride, silicon carbide, silicon carbonitride, silicon oxycarbonitride, silicon oxynitride, boron nitride and boron carbonitride. Specifically, the materials of the source/drain cap layer 155 and the gate cap layer 145 are different, and the materials of the source/drain cap layer 155 and the dummy spacer 120 are different. In an example, the material of the source/drain cap layer 155 is silicon carbide.

Figure 8:
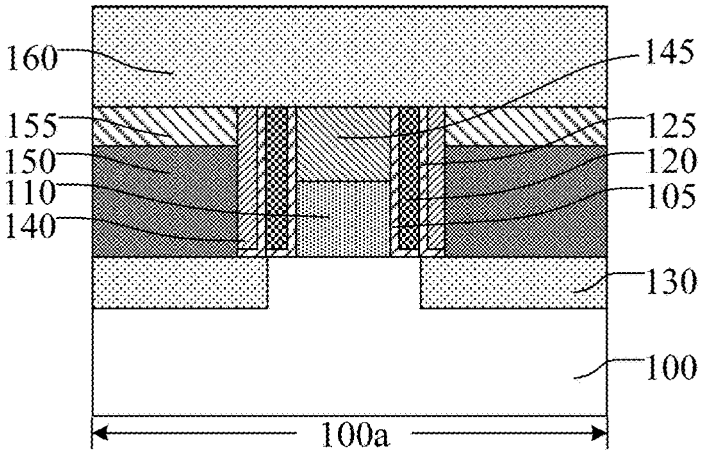

Referring to FIG. 8, a top dielectric layer 160 is formed on the bottom dielectric layer 135 to cover the gate structure 110 and the source/drain interconnect layer 150.

Subsequently, the source/drain plug contacting the source/drain interconnect layer 150 and the gate plug contacting the gate structure 110 are formed in the top dielectric layer 160. The top dielectric layer 160 is configured to realize electrical isolation between the source/drain plug and the gate plug. Besides, in this implementation, the top dielectric layer 160 and the dummy spacer 120 are removed subsequently to form the second gap between the bottom dielectric layer 135 and the side wall of the gate structure 110. The cover dielectric layer sealing the top of the second gap is formed on the bottom dielectric layer 135. The top dielectric layer 160 is also configured to occupy a space position for the formation of the cover dielectric layer.

In this implementation, the top dielectric layer 160 covers the gate cap layer 145 and the source/drain cap layer 155.

The material of the top dielectric layer 160 is an insulating material. Moreover, in this implementation, the top dielectric layer 160 is etched subsequently, so the top dielectric layer 160 is made of an easily etchable material. The material of the top dielectric layer 160 includes one or more of silicon oxide, silicon carbide, silicon carbonitride, silicon oxycarbonitride, silicon oxynitride, boron nitride, boron carbonitride, aluminum oxide and aluminum nitride. In this implementation, the material of the top dielectric layer 160 is silicon oxide.

Figure 9:
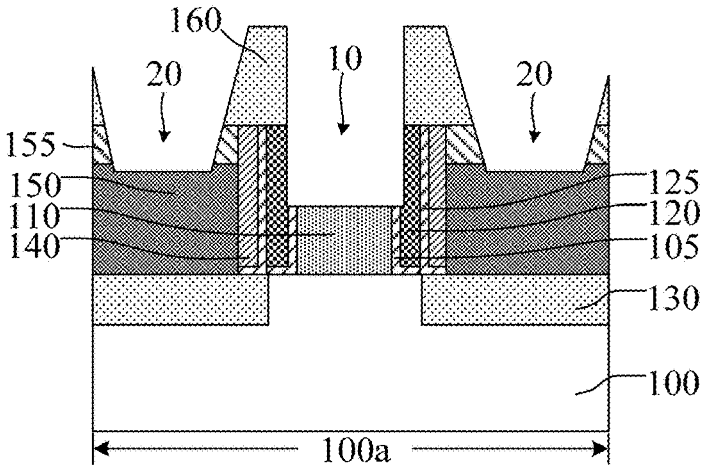

Referring to FIG. 9, a gate contact 10 running through the top dielectric layer 160 on the top of the gate structure 110 and exposing the top of the gate structure 110, and a source/drain contact 20 running through the top dielectric layer 160 on the top of the source/drain interconnect layer 150 and exposing the top of the source/drain interconnect layer 150 are formed.

The gate contact 10 is configured to provide a space position for the formation of the gate plug. The source/drain contact 20 is configured to provide a space position for the formation of the source/drain plug. In this implementation, the gate contact 10 and the source/drain contact 20 are also configured to reserve a space for the subsequent formation of the sacrificial side wall layer, and the side walls of the gate contact 10 and the source/drain contact 20 are configured to provide a support for the formation of the sacrificial side wall layer.

The subsequently formed sacrificial side wall layer has a thickness. Therefore, in order to make the gate contact 10 reserve a sufficient space for the formation of the sacrificial side wall layer and the gate plug, in this implementation, the dimension of the opening of the gate contact 10 may be appropriately increased according to the actual process requirements. Similarly, in order to make the source/drain contact 20 reserve a sufficient space for the formation of the sacrificial side wall layer and the source/drain plug, in this implementation, the dimension of the opening of the source/drain contact 20 may be appropriately increased according to the actual process requirements.

In this implementation, the gate contact 10 runs through the gate cap layer 145 and the top dielectric layer 160 on the top of the gate structure 110 in the active area **100*a*. Specifically, in this implementation, in order to increase the dimension of the gate contact 10, the gate contact 10 also runs through a part of the offset spacer 105 located on the side wall of the gate cap layer 145. Therefore, the gate contact 10 also exposes a part of the dummy spacer 120**.

In this implementation, the source/drain contact 20 runs through the source/drain cap layer 155 and the top dielectric layer 160 on the top of the source/drain interconnect layer 150.

In this implementation, the source/drain contact 20 and the gate contact 10 are respectively formed in different steps.

Figure 10:
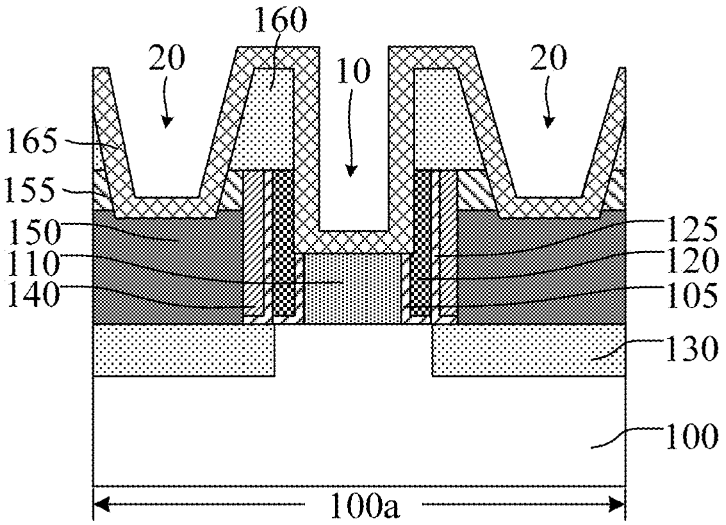
Figure 11:
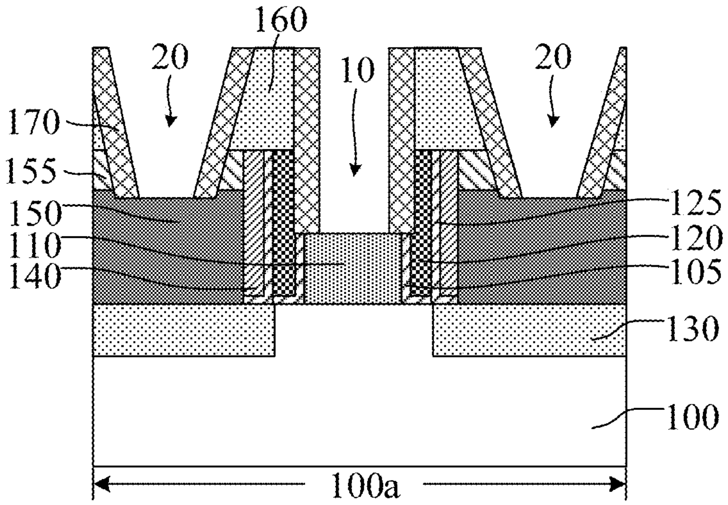

Referring to FIG. 10 to FIG. 11, a sacrificial side wall layer 170 is formed on the side walls of the gate contact 10 and the source/drain contact 20.

After the sacrificial side wall layer 170 is formed, the remaining space in the gate contact 10 is configured to form the gate plug, and the remaining space in the source/drain contact 20 is configured to form the source/drain plug.

The sacrificial side wall layer 170 is configured to occupy a space for the formation of the first gap. That is, subsequently, the sacrificial side wall layer 170 is removed to form the first gap exposing the side wall of the gate plug and the side wall of the source/drain plug, and the sealing layer sealing the first gap is formed on the gate plug and the source/drain plug, so that the first gap and the sealing layer form the first air gap. The air gap has a lower dielectric constant than the dielectric material (for example, a low k dielectric material or an ultra-low k dielectric material) commonly used in the semiconductor process, which is beneficial to reduce the parasitic capacitance between the gate plug and the source/drain plug and reduce the delay of RC, thereby improving the performance of the semiconductor structure.

Subsequently, the sacrificial side wall layer 170 needs to be removed, so the sacrificial side wall layer 170 is made of a material that can be easily removed, thereby reducing the difficulty in removing the sacrificial side wall layer 170. Moreover, the material of the sacrificial side wall layer 170 is a material having an etch selectivity with the gate cap layer 145, the source/drain cap layer 155, the bottom dielectric layer 135, the top dielectric layer 160, the source/drain plug and the gate plug, so that the sacrificial side wall layer 170 has an etch selectivity with these layer structures in the subsequent step of removing the sacrificial side wall layer 170, which is beneficial to reduce the damage to other layers due to the removal of the sacrificial side wall layer 170, thereby improving the process compatibility.

In this implementation, the material of the sacrificial side wall layer 170 includes one or more of amorphous silicon, silicon oxycarbide, silicon oxide, silicon nitride, silicon carbide, boron nitride, aluminum oxide, aluminum nitride and silicon oxynitride. In an example, the material of the sacrificial side wall layer 170 is amorphous silicon.

It should be noted that along the direction perpendicular to the side wall of the gate contact 10 or perpendicular to the side wall of the source/drain contact 20, the thickness of the sacrificial side wall layer 170 should not be too small or too large. If the thickness of the sacrificial side wall layer 170 is too small, the width of the first gap subsequently formed by removing the sacrificial side wall layer 170 will be also too small, and the width of the first air gap will be too small accordingly, so that the first air gap has an insignificant effect of reducing the parasitic capacitance between the source/drain plug and the gate plug. If the thickness of the sacrificial side wall layer 170 is too large, then the width of the first gap will also be too large, and the material of the sealing layer may easily fill the first gap subsequently, thereby making it difficult to form the first air gap. Moreover, the too large width of the sacrificial side wall layer 170 also increases the difficulty of subsequent removal of the sacrificial side wall layer 170 and correspondingly increases the risk of the process. Therefore, in this implementation, the thickness of the sacrificial side wall layer 170 is 10 Å to 40 Å. For example, the thickness of the sacrificial side wall layer 170 is 20 Å or 30 Å.

The step of forming the sacrificial side wall layer 170 will be described in detail below in conjunction with the accompanying drawings.

As shown in FIG. 10, a side wall material layer 165 is formed on the side wall and a bottom of the gate contact 10, the side wall and a bottom of the source/drain contact 20 and a top surface of the top dielectric layer 160.

A process for forming the side wall material layer 165 includes one or both of atomic layer deposition and chemical vapor deposition. In an example, the side wall material layer 165 is formed by atomic layer deposition. The atomic layer deposition is a self-limiting reaction process based on an atomic layer deposition process. The deposited film can reach a thickness of a single layer of atoms, which is beneficial to the formation of a thinner side wall material layer 165, and correspondingly makes the thickness of the sacrificial side wall layer to meet the process requirements. Moreover, the atomic layer deposition has a high step covering power, thereby improving the covering power of the side wall material layer 165 on the side walls of the gate contact 10 and the source/drain contact 20 and correspondingly improving the thickness uniformity and film forming quality of the side wall material layer 165.

In other implementations, the side wall material layer may alternatively be formed by chemical vapor deposition. The chemical vapor deposition may be a conventional chemical vapor deposition process, or a chemical vapor deposition process with plasma treatment. The chemical vapor deposition process with plasma treatment includes multiple deposition cycles. Each deposition cycle, after the film is deposited, further includes performing plasma treatment on the deposited film to improve the density and covering power of the film. Specifically, a gas used in the plasma treatment includes one or more of hydrogen, helium, argon, oxygen and nitrogen. The plasma treatment can reduce or remove dangling bonds on the surface of the deposited film by using the plasma with energy, thereby improving the density of the deposited film and preparing for the next deposition cycle.

As shown in FIG. 11, the side wall material layer 165 on the bottoms of the gate contact 10 and the source/drain contact 20 and on the top surface of the top dielectric layer 160 is removed, and the remaining side wall material layer 165 located on the side walls of the gate contact 10 and the source/drain contact 20 serves as the sacrificial side wall layer 170.

Since the side wall material layer 165 conformally covers the bottoms and the side walls of the gate contact 10 and the source/drain contact 20 and the top surface of the top dielectric layer 160, in this implementation, the side wall material layer 165 located on the bottoms of the gate contact 10 and the source/drain contact 20 and on the top surface of the top dielectric layer 160 can be removed by anisotropic etching without a mask. The anisotropic etching has the characteristics of anisotropic etching. This etching speed of this etching process along the direction perpendicular to the surface of the base 100 (i.e., longitudinal direction) is greater than the etching speed along the direction parallel to the base 100 (i.e., lateral direction), so that the side wall material layer 165 located on the bottoms of the gate contact 10 and the source/drain contact 20 and on the top surface of the top dielectric layer 160 can be removed by etching while the side wall material layer 165 on the side walls of the gate contact 10 and the source/drain contact 20 can be reserved and serve as the sacrificial side wall layer. Specifically, the anisotropic etching includes anisotropic dry etching. The dry etching has high controllability, etching accuracy and etching efficiency.

Figure 12:
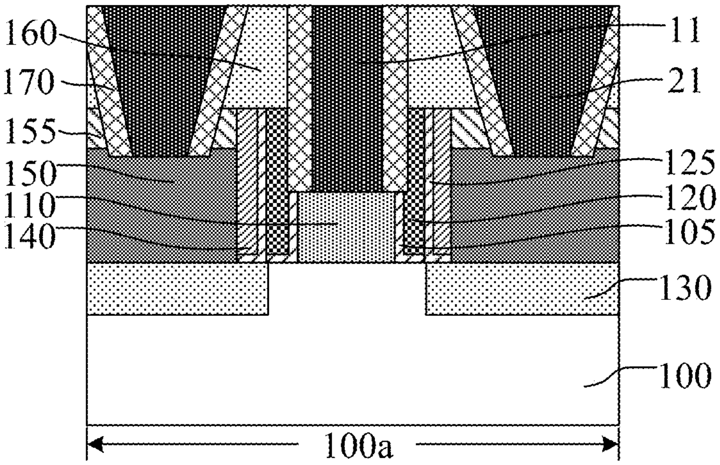

Referring to FIG. 12, on the sacrificial side wall layer 170, the gate plug 11 filling the gate contact 10 and the source/drain plug 21 filling the source/drain contact 20 are formed.

The gate plug 11 is configured to electrically connect between the gate structure 110 and an external circuit or other interconnect structures.

In this implementation, the gate plug 11 is formed above the gate structure 110 in the active area 100*a*, and the gate plug 11 is a contact over active gate (COAG), which is beneficial to save the area of the chip, thereby further reducing the chip dimensions.

The source/drain plug 21 contacts the source/drain interconnect layer 150, so that the source/drain doped area 130 can be electrically connected to the external circuit or other interconnect structures through the source/drain interconnect layer 150.

For the specific description of the materials of the gate plug 11 and the source/drain plug 21, reference may be made to the foregoing description of the source/drain interconnect layer 150, and details will not be repeated here.

In this implementation, after the source/drain contact 20 and the gate contact 10 are formed, the top source/drain plug 21 and the gate plug 11 are formed in the same step.

It should be noted that in this implementation, after the gate plug 11 and the source/drain plug 21 are formed, the method for forming a semiconductor structure further includes steps as follows.

Figure 13:
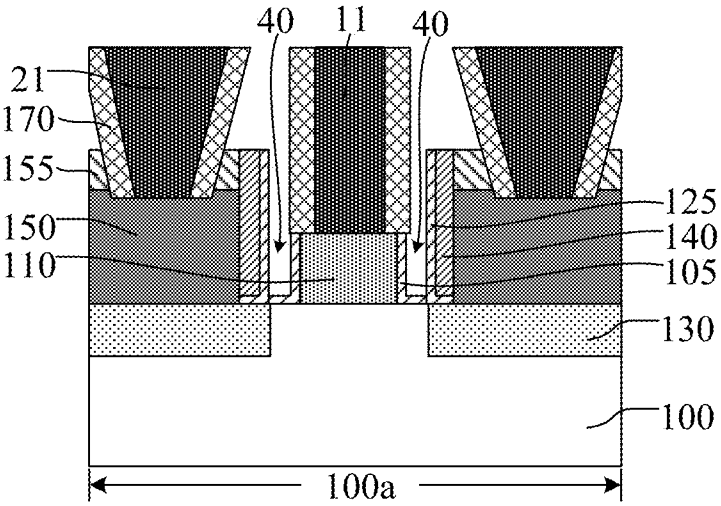

Referring to FIG. 13, the top dielectric layer 160 located between the top of the dummy spacer 120 and the sacrificial side wall layer 170 is etched to expose the top surface of the dummy spacer 120 and the side wall of the sacrificial side wall layer 170. The dummy spacer 120 is removed to form a second gap 40 between the contact etch stop layer 140 the side wall of the gate structure 110.

The second gap 40 is configured to provide a space for the subsequent formation of the cover dielectric layer. Specifically, in this implementation, the second gap 40 is formed between the anti-diffusion layer 125 and the offset spacer 105 and between the anti-diffusion layer 125 and the sacrificial side wall layer 170.

In this implementation, the top dielectric layer 160 and the dummy spacer 120 are removed by isotropic etching. The use of the isotropic etching can completely remove the top dielectric layer 160 and the dummy spacer 120, and moreover, the etching speed is higher. In this implementation, the isotropic etching is remote plasma etching. The remote plasma etching has the characteristics of isotropic etching. Moreover, the remote plasma etching also has good etch selectivity, thereby reducing the loss of other layers during etching. The remote plasma etching is based on the following principle: plasma is formed outside the etching chamber (for example, the plasma is generated by a remote plasma generator), and then introduced into the etching chamber, and the etching is performed by utilizing a chemical reaction between the plasma and the layer to be etched. Therefore, the isotropic etching effect can be realized. Moreover, there is no ion bombardment, so the remote plasma etching does not damage other layers.

In other implementations, the isotropic etching may alternatively be wet etching.

In this implementation, the materials of the top dielectric layer 160 and the dummy spacer 120 are the same, so the top dielectric layer 160 and the dummy spacer 120 can be removed in the same etching step, thereby simplifying the process steps.

Figure 14:
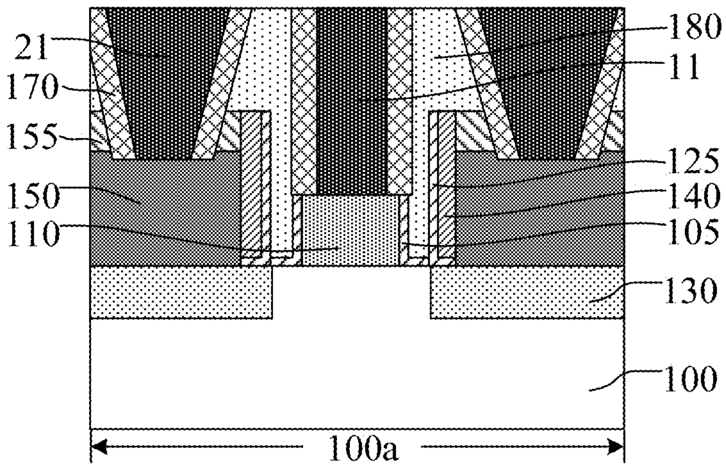

Referring to FIG. 14, a cover dielectric layer 180 covering the side wall of the sacrificial side wall layer 170 is formed on the bottom dielectric layer 135. The cover dielectric layer 180 seals the second gap 40, and a dielectric constant of a material of the cover dielectric layer 180 is lower than the dielectric constant of the material of the dummy spacer 120.

By removing the dummy spacer 120 and forming the cover dielectric layer 180 whose material has a lower dielectric constant, the cover dielectric layer 180 seals the second gap 40, so that the effective capacitance between the gate structure 110 and the source/drain interconnect layer 150 is reduced, thereby improving the performance of the semiconductor structure. Besides, in this implementation, the cover dielectric layer 180 is also configured to realize electrical isolation between the source/drain plug 21 and the gate plug 11. Moreover, the sacrificial side wall layer 170 is removed subsequently, so that the first gap is formed between the cover dielectric layer 180 and the side wall of the gate plug 11 or the side wall of the source/drain plug 21. The cover dielectric layer 180 also provides a support for the subsequent formation of the sealing layer sealing the first gap.

This implementation is an example where the cover dielectric layer 180 fills the second gap 40 so as to seal the second gap 40. In other implementations, when the second gap has a large aspect ratio (AR), the cover dielectric layer can also seal the top of the second gap, so that the second gap and the cover dielectric layer form a second air gap. The air has a lower dielectric constant, and accordingly is beneficial to further reduce the effective capacitance between the gate structure and the source/drain interconnect layer.

In this implementation, the material of the cover dielectric layer 180 includes a low k dielectric material or an ultra-low k dielectric material, which is beneficial to reduce the effective capacitance between the gate structure 110 and the source/drain interconnect layer 150 and the parasitic capacitance between the source/drain plug 21 and the gate plug 11, thereby reducing the delay of RC of the interconnect structure in the integrated circuit.

A process for forming the cover dielectric layer 180 includes one or more of flowable chemical vapor deposition, atomic layer deposition, spin-on coating and chemical vapor deposition. In this implementation, the process for forming the cover dielectric layer 180 includes spin-on coating. The spin-on coating is performed at a low temperature, which avoids the channel degradation caused by high temperature and is beneficial to improve the performance of the semiconductor structure. Moreover, the spin-on coating has higher gap filling ability, which is beneficial to improve the quality of the cover dielectric layer 180 filling the second gap 40 and between the source/drain plug 21 and the gate plug 11.

In this implementation, the step of forming the cover dielectric layer 180 includes: a dielectric material layer (not shown) covering the side wall of the sacrificial side wall layer 170 is formed on the bottom dielectric layer 135. The dielectric material layer also covers the tops of the gate plug 11 and the source/drain plug 21, and the dielectric material layer seals the second gap 40. The dielectric material layer higher than tops of the gate plug 11 and the source/drain plug 21 is removed.

In this implementation, the dielectric material layer is formed by spin-on coating.

Figure 15:
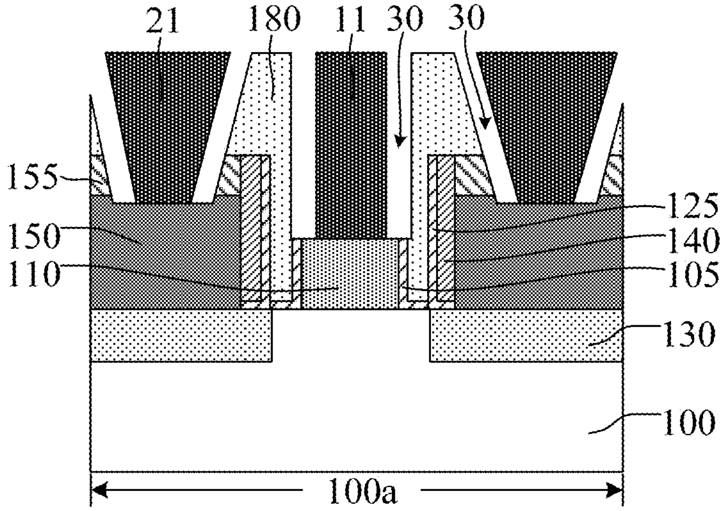

Referring to FIG. 15, the sacrificial side wall layer 170 is removed to form the first gap 30 exposing the side wall of the gate plug 11 and the side wall of the source/drain plug 21. The first gap 30 is configured to form the first air gap with the subsequently formed sealing layer.

In this implementation, the first gap 30 is formed between the cover dielectric layer 180 and the side wall of the gate plug 11 and between the cover dielectric layer 180 and the side wall of the source/drain plug 21.

In this implementation, the sacrificial side wall layer 170 is removed by isotropic etching. The use of the isotropic etching can completely remove the sacrificial side wall layer 170, and moreover, the etching speed is higher.

In this implementation, the isotropic etching is remote plasma etching. The remote plasma etching has the characteristics of isotropic etching. Moreover, the remote plasma etching also has good etch selectivity, thereby reducing the loss of other layers during etching. The remote plasma etching is based on the following principle: plasma is formed outside the etching chamber (for example, the plasma is generated by a remote plasma generator), and then introduced into the etching chamber, and the etching is performed by utilizing a chemical reaction between the plasma and the layer to be etched. Therefore, the isotropic etching effect can be realized. Moreover, there is no ion bombardment, so the remote plasma etching does not damage other layers.

In other implementations, the isotropic etching may alternatively be wet etching.

Figure 16:
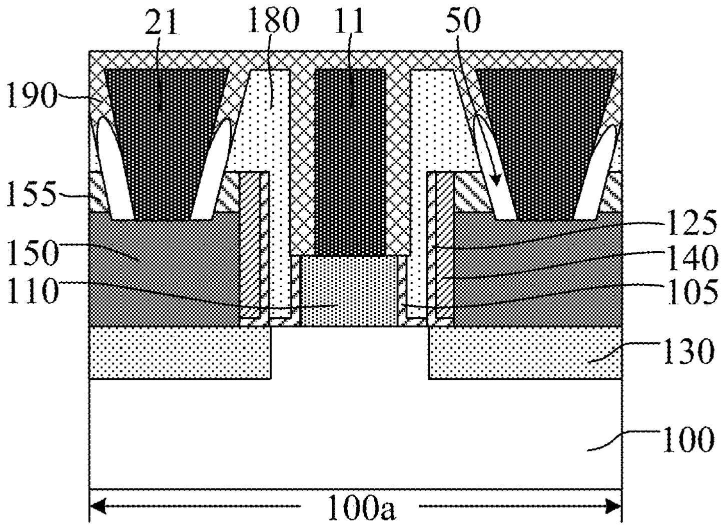

Referring to FIG. 16, the sealing layer 190 sealing the first gap 30 is formed, so that at least one of the first gap 30 located on the side wall of the source/drain plug 21 and the first gap 30 located on the side wall of the gate plug 11 and the sealing layer 190 form the first air gap 50.

In this implementation, at least one of the first gap 30 located on the side wall of the source/drain plug 21 and the first gap 30 located on the side wall of the gate plug 11 and the sealing layer 190 form the first air gap 50. The air gap has a lower dielectric constant than the dielectric material (for example, a low k dielectric material or an ultra-low k dielectric material) commonly used in the semiconductor process, which is beneficial to reduce the parasitic capacitance between the gate plug 11 and the source/drain plug 21 and reduce the delay of RC, thereby improving the performance of the semiconductor structure.

In this implementation, the gate plug 11 is a contact over active gate (COAG). Compared with the conventional gate plug located in the isolation area, in this implementation, the distance between the gate plug 11 and the source/drain plug 12 is shorter. The first gap 30 is formed on the side wall of the gate plug 11 and the side wall of the source/drain plug 21, and the first gap 30 is sealed to form the first air gap 50 on at least one of the side walls of the source/drain plug 21 and the gate plug 11, which is beneficial to significantly reduce the parasitic capacitance between the gate plug 11 and the source/drain plug 12 and reduce the delay of RC, thereby significantly improving the performance of the semiconductor structure.

In this implementation, the sealing layer 190 covers the tops of the source/drain plug 21, the gate plug 11 and the cover dielectric layer 180. The subsequent process further includes: a metal line is formed on the tops of the source/drain plug 21 and the gate plug 11 and configured to electrically connect between the source/drain plug 21 and the external circuit and between the gate plug 11 and the external circuit. The metal line is formed in an inter metal dielectric (IMD) layer. By making the sealing layer 190 cover the top of the source/drain plug 180, the sealing layer 190 higher than the top of the source/drain plug 180 serves as the inter metal dielectric layer, thereby simplifying the process steps of the BEOL, and making the sealing layer 190 compatible with the BEOL.

A material of the sealing layer 190 is a dielectric material. For the specific description of the material of the sealing layer 190, reference may be made to the foregoing description of the cover dielectric layer 180, and details will not be repeated here.

In an example, the sealing layer 190 contacts the corner at the top of the first gap 30 located on the side wall of the source/drain plug 21 so as to seal the top of the first gap 30, so that the first gap 30 located on the side wall of the source/drain plug 21 and the sealing layer 190 form the first air gap 50.

In an example, the sealing layer 190 fills the first gap 30 located on the side wall of the gate plug 11.

Specifically, in this implementation, a cross section of the source/drain plug 21 is in the shape of an inverted trapezoid, so the side wall of the first gap 30 located on the side wall of the source/drain plug 21 also has a certain inclination angle accordingly. A perpendicularity of the side wall of the gate plug 11 is greater than a perpendicularity of the side wall of the source/drain plug 21, so it is more difficult for the sealing layer 190 to fill the first gap 30 located on the side wall of the source/drain plug 21 than to fill the first gap 30 located on the side wall of the gate plug 11. Accordingly, it is easier for the sealing layer 190 to form the first air gap 50 with the first gap 30 on the side wall of the source/drain plug 21, and the sealing layer 190 can fill the first gap 30 on the side wall of the gate plug 11.

In other implementations, according to an aspect ratio of the first gap located on the gate plug, the morphology of the cross section of the gate plug, the inclination angle of the side wall of the first gap and other actual process conditions, the sealing layer can also contact the corner at the top of the first gap located on the side wall of the gate plug so as to seal the top of the first gap, so that the first gap located on the side wall of the gate plug and the sealing layer also form the first air gap. In some other implementations, it is also possible to make only the first gap located on the side wall of the gate plug and the sealing layer form the first air gap.

In this implementation, the sealing layer 190 is formed by a deposition process with lower filling ability, so that the sealing layer 190 cannot easily fill the first gap 30, which makes the sealing layer 190 easily contact the corner at the top of the first gap 30 to form the first air gap 50. In this implementation, a process for forming the sealing layer 190 includes one or both of chemical vapor deposition and plasma enhanced chemical vapor deposition.

It should be noted that in this implementation, the COAG process is taken In an example. In other implementations, when the gate plug is located on the top of the gate structure in the isolation area, the method for forming a semiconductor structure according to this implementation can still reduce the parasitic capacitance between the source/drain plug and the gate structure.

Accordingly, the present disclosure further provides a semiconductor structure. Referring to FIG. 16, a schematic structural diagram of an implementation of a semiconductor structure of the present disclosure is shown.

The semiconductor structure includes: a base 100; a gate structure 110 located on the base 100; a source/drain doped area 130 located in the base 100 on two sides of the gate structure 110; a source/drain interconnect layer 150 located on a top of the source/drain doped area 130 and contacting the source/drain doped area 130; a gate plug 11 located on a top of the gate structure 110 and contacting the gate structure 110; a source/drain plug 21 located on a top of the source/drain interconnect layer 150 and contacting the source/drain plug 21; a dielectric layer 180, covering side walls of the gate plug 11 and the source/drain plug 21 and filling between the gate plug 11 and the source/drain plug 21; a first gap 30 (as shown in FIG. 15) located between the side wall of the gate plug 11 and the dielectric layer 180 and between the side wall of the source/drain plug 21 and the dielectric layer 180; and a sealing layer 190 located on the dielectric layer 180 and sealing the first gap 30, at least one of the first gap 30 located on the side wall of the source/drain plug 21 and the first gap 30 located on the side wall of the gate plug 11 and the sealing layer 190 forming a first air gap 50.

By arranging the first gap 30 exposing the side wall of the gate plug 11 and the side wall of the source/drain plug 12 and arranging the sealing layer 190, at least one of the first gap 30 located on the side wall of the source/drain plug 21 and the first gap 30 located on the side wall of the gate plug 11 and the sealing layer 190 form the first air gap 50. The air gap has a lower dielectric constant than the dielectric material (for example, a low k dielectric material or an ultra-low k dielectric material) commonly used in the semiconductor process, which is beneficial to reduce the parasitic capacitance between the gate plug 11 and the source/drain plug 21 and reduce the delay of RC, thereby improving the performance of the semiconductor structure.

The base 100 is configured to provide a platform for the subsequent process. In this implementation, the base 100 is a planar substrate. In this implementation, the base 100 is a silicon substrate. The base 100 includes an active area 100*a*.

The gate structure 110, as a gate of a device, is configured to control a conductive channel to be on or off when the device works.

In this implementation, the gate structure 110 is a metal gate structure, and the gate structure 110 is formed by a high k last metal gate last process.

The source/drain doped area 130 is configured to provide a carrier source when the device works.

In this implementation, the semiconductor structure further includes: a bottom dielectric layer 135 (as shown in FIG. 6) located on the base 100 exposed by the gate structure 110. The bottom dielectric layer 135 is configured to isolate adjacent devices. In this implementation, the material of the bottom dielectric layer 135 is silicon oxide.

The source/drain interconnect layer 150 contacts the source/drain doped area 130 and is configured to electrically connect between the source/drain doped area 130 and an external circuit or other interconnect structures. In this implementation, a material of the source/drain interconnect layer 150 is copper. In other implementations, the material of the source/drain interconnect layer may alternatively be a conductive material such as tungsten, cobalt or the like.

In this implementation, the source/drain interconnect layer 150 runs through the bottom dielectric layer 135 located on the source/drain doped area 130.

In this implementation, the semiconductor structure further includes: a gate cap layer 145 (as shown in FIG. 8) located between the top of the gate structure 110 and the dielectric layer 180; and a source/drain cap layer 155 located between the top of the source/drain interconnect layer 150 and the dielectric layer 180.

In this implementation, a top surface of the source/drain cap layer 155 is flush with the top surface of the bottom dielectric layer 135.

The source/drain cap layer 155 is located on a top surface of the source/drain interconnect layer 150 and configured to protect the source/drain interconnect layer 150 during the formation of the gate plug 11, which is beneficial to reduce the damage to the source/drain interconnect layer 150 and the probability of short-circuiting between the gate plug 11 and the source/drain interconnect layer 150.

The gate cap layer 145 is configured to protect the top of the gate structure 110 during the formation of the source/drain interconnect layer 150 and the formation of the source/drain plug 21, thereby reducing the damage to the gate structure 110 and the probability of short-circuiting between the gate structure 110 and the source/drain interconnect layer 150 or the source/drain plug 11.

For the detailed description of the materials of the gate cap layer 145 and the source/drain cap layer 155, reference may be made to the corresponding description in the foregoing implementations, and details will not be repeated here.

In this implementation, the semiconductor structure further includes: a contact etch stop layer 140 located on the base 100 between the side wall of the source/drain interconnect layer 150 and the gate structure 110 and arranged opposite to the side wall of the gate structure 110, where a second gap 40 (as shown in FIG. 13) is formed between the contact etch stop layer 140 and the side wall of the gate structure 110.

The contact etch stop layer 140 is further located on the top surface of the source/drain doped area 130. The contact etch stop layer 140 is configured to temporarily define an etch stop position during the formation of the source/drain interconnect layer 150, thereby improving the etching consistency and helping to prevent damage to the source/drain doped area 130. In this implementation, a material of the contact etch stop layer 140 is a low k dielectric material or an ultra-low k dielectric material, so that the contact etch stop layer 140 can further reduce the effective capacitance between the gate structure 110 and the source/drain interconnect layer 150. In other implementations, the material of the contact etch stop layer may alternatively be silicon nitride.

In this implementation, the dielectric layer 180 is a cover dielectric layer 180. The cover dielectric layer 180 seals the second gap 40. The second gap 40 is configured to provide a space for the formation of the cover dielectric layer 180.

The cover dielectric layer 180 seals the second gap 40, so that the effective capacitance between the gate structure 110 and the source/drain interconnect layer 150 is reduced, thereby improving the performance of the semiconductor structure.

In this implementation, the material of the cover dielectric layer 180 includes a low k dielectric material or an ultra-low k dielectric material. In this implementation, the cover dielectric layer 180 fills the second gap 40. In other implementations, when the second gap has a large aspect ratio (AR), the cover dielectric layer seals the top of the second gap, so that the second gap and the cover dielectric layer form a second air gap. The air has a lower dielectric constant, and accordingly is beneficial to further reduce the effective capacitance between the gate structure and the source/drain interconnect layer.

In this implementation, in a direction parallel to a surface of the base 100 and perpendicular to the side wall of the gate structure 110, a width of the second gap 40 is 2 nm to 12 nm.

In this implementation, the semiconductor structure further includes: an anti-diffusion layer 125 located on a side wall of the contact etch stop layer 140 exposed by the second gap 40. The second gap 40 is formed by removing the dummy spacer. The anti-diffusion layer 125 is configured to prevent diffusible ions in the dummy spacer from diffusing into the contact etch stop layer 140, thereby avoiding adverse effects on the contact etch stop layer 140 due to ion diffusion.

Therefore, the anti-diffusion layer 125 has higher density, and the material of the anti-diffusion layer 125 is an insulating material. Specifically, the material of the anti-diffusion layer 125 includes one or more of silicon nitride, silicon carbide, silicon carbonitride, silicon oxycarbonitride, silicon oxynitride, boron nitride, boron carbonitride, aluminum oxide and aluminum nitride. In an example, the material of the anti-diffusion layer 125 is silicon nitride.

It should be noted that the anti-diffusion layer 125 is also located between the source/drain interconnect layer 150 and the gate structure 110, so the anti-diffusion layer 125 also affects the effective capacitance between the source/drain interconnect layer 150 and the gate structure 110. Therefore, while ensuring the effectiveness of the anti-diffusion layer 125 in preventing ion diffusion, in order to prevent an excessive effective capacitance between the source/drain interconnect layer 150 and the gate structure 110 and avoid occupying too much area of the chip, the thickness of the anti-diffusion layer 125 is less than or equal to 30 Å. In this implementation, the thickness of the anti-diffusion layer 125 is less than or equal to 15 Å. An excessively small thickness of the anti-diffusion layer 125 may cause the anti-diffusion layer 125 to become less effective in preventing ion diffusion. In this implementation, the thickness of the anti-diffusion layer 125 is 5 Å to 15 Å.

In this implementation, the semiconductor structure further includes: an offset spacer 105 located on the side wall of the gate structure 110 exposed by the second gap 40. The offset spacer 105 is configured to improve the short-channel effect and the hot carrier effect caused by the short-channel effect.

In this implementation, the offset spacer 105 is also located on the base 100 exposed by the second gap 40. A material of the offset spacer 105 is silicon oxide, silicon nitride, silicon oxynitride, silicon oxycarbonitride, silicon oxyboronitride or silicon oxyborocarbonitride.

The gate plug 11 is configured to electrically connect between the gate structure 110 and an external circuit or other interconnect structures.

In this implementation, the gate plug 11 is located above the gate structure 110 in the active area 100*a*. The gate plug 11 is a contact over active gate. Compared with the solution in which the gate plug contacts the gate structure in the isolation area, this implementation omits the part of the gate structure 110 in the isolation area, which is beneficial to save the area of the chip and further reduce chip dimensions.

The source/drain plug 21 contacts the source/drain interconnect layer 150, so that the source/drain doped area 130 can be electrically connected to the external circuit or other interconnect structures through the source/drain interconnect layer 150.

For the specific description of the gate plug 11 and the source/drain plug 21, reference may be made to the foregoing description of the source/drain interconnect layer 150, and details will not be repeated here.

In this implementation, the cover dielectric layer 180 seals the second gap 40, so that the effective capacitance between the gate structure 110 and the source/drain interconnect layer 150 is reduced, thereby improving the performance of the semiconductor structure. Besides, in this implementation, the cover dielectric layer 180 is also configured to realize electrical isolation between the source/drain plug 21 and the gate plug 11. Moreover, the cover dielectric layer 180 also provides a support for the formation of the sealing layer 190 sealing the first gap 30.

In this implementation, the material of the cover dielectric layer 180 includes a low k dielectric material or an ultra-low k dielectric material, which can reduce the effective capacitance between the gate structure 110 and the source/drain interconnect layer 150 and is also beneficial to reduce the parasitic capacitance between the source/drain plug 21 and the gate plug 11, thereby reducing the delay of RC.

The first gap 30 is configured to form the first air gap 50, which thereby is beneficial to reduce the parasitic capacitance between the source/drain plug 21 and the gate plug 11.

Along the direction perpendicular to the side wall of the gate plug 11 or perpendicular to the side wall of the source/drain plug 21, the width of the first gap 30 should not be too small or too large. If the width of the first gap 30 is too small, the width of the first air gap 50 will be also too small, so that the first air gap 50 has an insignificant effect of reducing the parasitic capacitance between the source/drain plug 21 and the gate plug 11. If the width of the first gap 30 is too large, then the material of the sealing layer 190 may easily fill the first gap 30, making it difficult to form the first air gap 50. Therefore, in this implementation, along the direction perpendicular to the side wall of the gate plug 11 or perpendicular to the side wall of the source/drain plug 21, the width of the first gap 30 is 10 Å to 40 Å. For example, the width of the first gap 30 is 20 Å or 30 Å.

The sealing layer 190 is configured to seal the first gap 30, thereby forming the first air gap 50. The air gap has a lower dielectric constant than the dielectric material (for example, a low k dielectric material or an ultra-low k dielectric material) commonly used in the semiconductor process, which is beneficial to reduce the parasitic capacitance between the gate plug 11 and the source/drain plug 21 and reduce the delay of RC, thereby improving the performance of the semiconductor structure.

In this implementation, the gate plug 11 is a contact over active gate (COAG). Compared with the conventional gate plug located in the isolation area, in this implementation, the distance between the gate plug 11 and the source/drain plug 12 is shorter. The first air gap 50 is arranged, which is beneficial to significantly reduce the parasitic capacitance between the gate plug 11 and the source/drain plug 12 and reduce the delay of RC, thereby significantly improving the performance of the semiconductor structure.

In this implementation, the sealing layer 190 covers the tops of the source/drain plug 21, the gate plug 11 and the cover dielectric layer 180. The subsequent process further includes: a metal line is formed on the tops of the source/drain plug 21 and the gate plug 11 and configured to electrically connect between the source/drain plug 21 or the gate plug 11 and the external circuit. The metal line is formed in an inter metal dielectric (IMD) layer. By making the sealing layer 190 cover the top of the source/drain plug 180, the part of the sealing layer 190 higher than the top of the source/drain plug 180 serves as the inter metal dielectric layer, thereby simplifying the process steps of the BEOL, and making the sealing layer 190 compatible with the BEOL.

A material of the sealing layer 190 is a dielectric material. For the specific description of the material of the sealing layer 190, reference may be made to the foregoing description of the cover dielectric layer 180, and details will not be repeated here.

In an example, the sealing layer 190 contacts the corner at the top of the first gap 30 located on the side wall of the source/drain plug 21 so as to seal the top of the first gap 30, so that the first gap 30 located on the side wall of the source/drain plug 21 and the sealing layer 190 form the first air gap 50.

In an example, the sealing layer 190 fills the first gap 30 located on the side wall of the gate plug 11.

Specifically, in this implementation, a cross section of the source/drain plug 21 is in the shape of an inverted trapezoid, so the side wall of the first gap 30 located on the side wall of the source/drain plug 21 also has a certain inclination angle accordingly. A perpendicularity of the side wall of the gate plug 11 is greater than a perpendicularity of the side wall of the source/drain plug 21, so it is more difficult for the sealing layer 190 to fill the first gap 30 located on the side wall of the source/drain plug 21 than to fill the first gap 30 located on the side wall of the gate plug 11. Accordingly, it is easier for the sealing layer 190 to form the first air gap 50 with the first gap 30 on the side wall of the source/drain plug 21, and the sealing layer 190 can fill the first gap 30 located on the side wall of the gate plug 11.

In other implementations, according to an aspect ratio of the first gap located on the side wall of the gate plug, the morphology of the cross section of the gate plug, the inclination angle of the side wall of the first gap and other actual process conditions, the sealing layer can also contact the corner at the top of the first gap located on the side wall of the gate plug so as to seal the top of the first gap, so that the first gap located on the side wall of the gate plug and the sealing layer also form the first air gap. In some other implementations, it is also possible to make only the first gap located on the side wall of the gate plug and the sealing layer form the first air gap.

It should be noted that this implementation is described by taking the gate plug 11 being a COAG In an example. In other implementations, when the gate plug is located on the top of the gate structure in the isolation area, the semiconductor structure according to this implementation can still reduce the parasitic capacitance between the source/drain plug and the gate structure.

The semiconductor structure may be formed by using the forming method described in the foregoing implementation, or may be formed by using other forming methods. For the detailed description of the semiconductor structure of this implementation, reference may be made to the corresponding description in the foregoing implementation, and details will not be repeated here in this implementation.

Although the present disclosure is disclosed above, the present disclosure is not limited thereto. A person skilled in the art can make various changes and modifications without departing from the spirit and the scope of the present disclosure. Therefore, the protection scope of the present disclosure should be subject to the scope defined by the claims.

What is claimed is:

1. A semiconductor structure, comprising:

a base;

a gate structure located on the base;

a source/drain doped area located in the base on two sides of the gate structure;

a source/drain interconnect layer located on a top of the source/drain doped area and contacting the source/drain doped area;

a gate plug located on a top of the gate structure and contacting the gate structure;

a source/drain plug located on a top of the source/drain interconnect layer and contacting the source/drain interconnect layer;

a dielectric layer, covering side walls of the gate plug and the source/drain plug and filling between the gate plug and the source/drain plug;

a first gap located between the side wall of the gate plug and the dielectric layer and between the side wall of the source/drain plug and the dielectric layer, wherein the first gap being is laterally bounded by the dielectric layer, and the first gap located between the side wall of the source/drain plug and the dielectric layer is isolated from the gate structure by the dielectric layer; and a sealing layer located on the dielectric layer and sealing the first gap, a first portion of the first gap located on the side wall of the source/drain plug or a second portion of the first gap located on the side wall of the gate plug and the sealing layer forming a first air gap.

2. The semiconductor structure according to claim 1, wherein the base comprises an active area, and the semiconductor structure further comprises:

a gate cap layer located between the top of the gate structure and the dielectric layer; and a source/drain cap layer located between the top of the source/drain interconnect layer and the dielectric layer, wherein the gate plug is located above the gate structure in the active area.

3. The semiconductor structure according to claim 1, wherein a width of the first gap is 10 Å to 40 Å along a direction perpendicular to the side wall of the gate plug or the source/drain plug.

4. The semiconductor structure according to claim 1, wherein the semiconductor structure further comprises:

a contact etch stop layer located on the base between the side wall of the source/drain interconnect layer and the gate structure and arranged opposite to the side wall of the gate structure, wherein a second gap is formed between the contact etch stop layer and the side wall of the gate structure; and the dielectric layer fills the second gap, or the dielectric layer seals a top of the second gap, and the second gap and the dielectric layer form a second air gap.

5. The semiconductor structure according to claim 1, wherein a material of the dielectric layer comprises a low k dielectric material or an ultra-low k dielectric material.

* * * * *